United States Patent
Jiahn-Chang

[11] Patent Number: 5,903,584
[45] Date of Patent: May 11, 1999

[54] LASER DIODE PACKAGE

[75] Inventor: Wu Jiahn-Chang, Hsin-Chu, Taiwan

[73] Assignee: Youngtek Electronics, Hsin-Chu, Taiwan

[21] Appl. No.: 09/002,936

[22] Filed: Jan. 5, 1998

[51] Int. Cl.$^6$ .............. H01S 3/04; H01S 3/18; H01S 3/00
[52] U.S. Cl. .................. 372/43; 372/36; 372/33
[58] Field of Search .................. 372/29, 33, 36, 372/43, 50

[56] References Cited

U.S. PATENT DOCUMENTS

| 4,736,231 | 4/1988 | Ayabe et al. | 372/50 |
| 4,764,931 | 8/1988 | Matsuda | 372/29 |
| 5,052,005 | 9/1991 | Tanaka et al. | 372/36 |

Primary Examiner—Rodney Bovernick
Assistant Examiner—Quyen Leung

[57] ABSTRACT

A surface-mounted flat package for a laser diode has the laser diode and light sensor diode mounted on top of a printed wiring insulating substrate. These diodes are connected to electrodes at the corners of the package. These electrodes may be fed through plated through via holes to form bottom electrodes. These via holes may be located at the four corners of the substrate or inside the edges of the package.

For mass production, a matrix of laser diode and sensor diode assemblies are mounted on a common substrate. The substrate is sawed orthogonally through or outside the via holes to yield a large number of dice.

13 Claims, 4 Drawing Sheets

LASER DIODE PACKAGE

BACKGROUND OF THE INVENTION

This invention relates to packages for laser diodes, in particular to surface-mounted packages.

In a conventional laser diode package, a laser diode is attached to a light sensor by means of manual spot welding, where corresponding terminals are mated. This method is slow and the quality is unstable. This process is not conducive to automatic production.

SUMMARY

An object of this invention is to speed up the attachment process of a surface-mounted flat package for laser diodes. Another object of this invention is to improve the quality of the attachment. Still another object of this invention is to make the process more amenable to production automation.

These objects are achieved by mounting a laser diode and light sensor diode on a printed wiring substrate. These diodes are connected to the electrodes at the edges of the substrate. These electrodes may be connected to the bottom of the substrate through plated-through via holes to form surface-mounted flat packages. These electrodes may also be wire-bonded to other connections on a mother board.

For mass production of the surface-mounted flat packages, a matrix of laser diode/light sensor assemblies are mounted on a common substrate with large number of plated-through via holes. The substrate is sawed orthogonally to yield a large number of dice. The sawing may cut through or outside the via holes.

BRIEF DESCRIPTION OF THE DRAWINGS

FIG. 8 shows a cover for the structures of FIGS. 2, 5 and 6.

FIG. 9 shows a cover without an opening.

DETAILED DESCRIPTION OF THE PREFERRED EMBODIMENT

Figure 1:
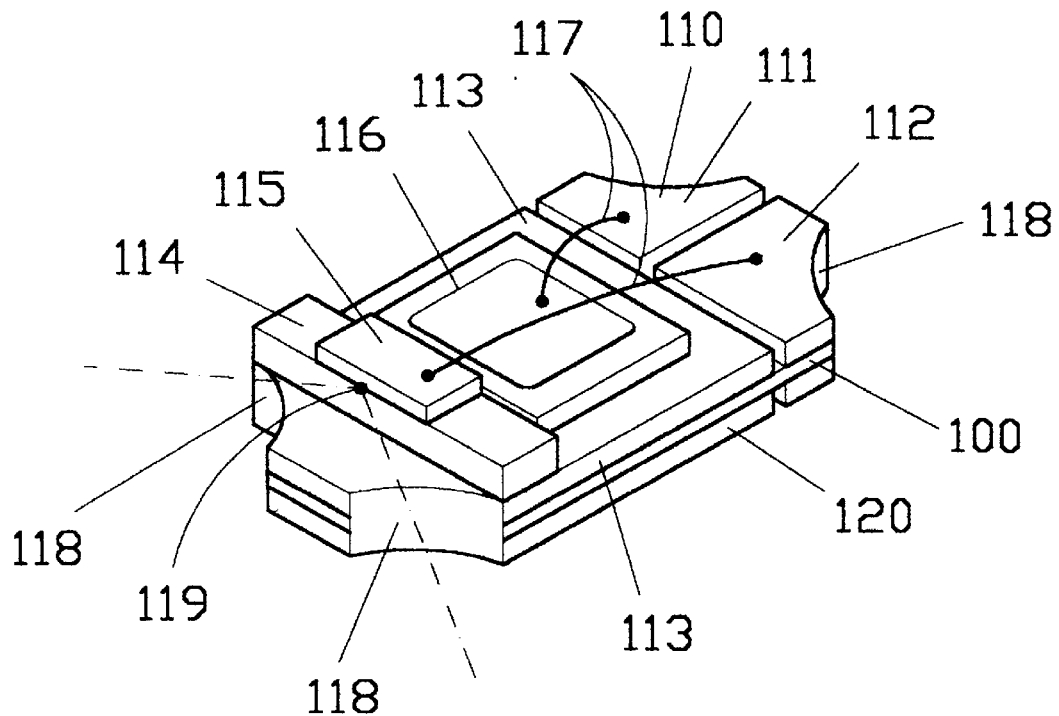
FIG. 1 shows a double-sided circuit board as a substrate of the present invention.

FIG. 1 shows the implementation of the present invention. An insulating substrate 100 is coated on top side 110 and bottom side 120 with conductive material. The upper side conductor 110 and the lower side conductor 120 are etched to have symmetrical circuit patterns. These circuits are connected to a first electrode 111, a second electrode 112 and a common electrode 113.

The etched patterns need not by symmetrical, so long as both the upper circuits and the lower circuits can be connected separately to the three electrodes and the package is convenient for mounting to a mother board. With a symmetrical pattern, the structure has a maximum heat dissipating area, thereby prolonging the life of the product.

The common electrode 113 has a conducting pedestal 114 on which a laser diode 115 is attached. The laser diode has a light emitting point 119. The bottom side of the laser diode 115 is connected to the common electrode 113. The top side of the laser diode 115 is wire bonded to the second electrode 112. A light sensor diode 116 is mounted over the laser diode 115 to sense the light intensity of the laser diode. The sensor diode also has provision to adjust light intensity of the laser diode to be uniform through a feed back circuit (not shown).

The first electrodes, the second electrodes and the common electrode which are patterned on the conducting material 110 on the top side and the conducting material 120 on the bottom side are correspondingly connected together through plated through via holes 118. Thus the package for the laser diode can be mounted on the mother board as a flat pack.

Figure 2:
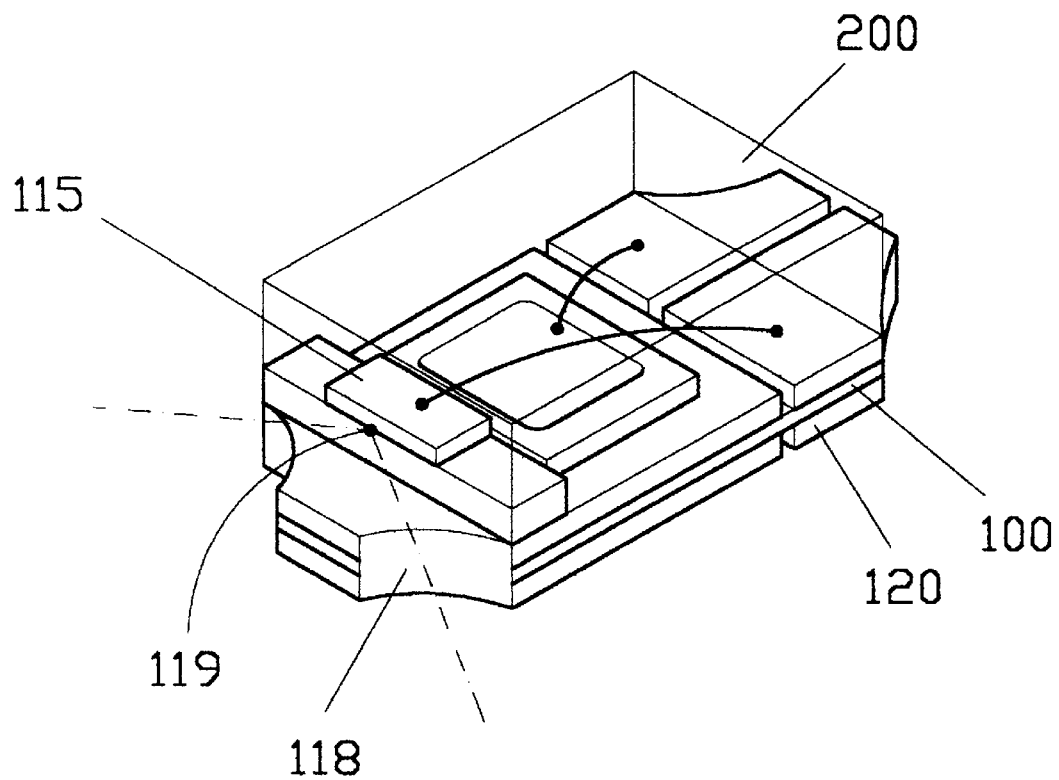
FIG. 2 shows the seal for the package of this the present invention.

FIG. 2 shows seal structure of the present invention. The seal protects the fragile wiring and the device, prolonging the life of the product. As shown in FIG. 2, the seal 200 seals all the devices on the substrate 100, except the light emitting point 119. Thus light intensity of the laser is not attenuated and the angle of the light source is not deflected.

Figure 3:
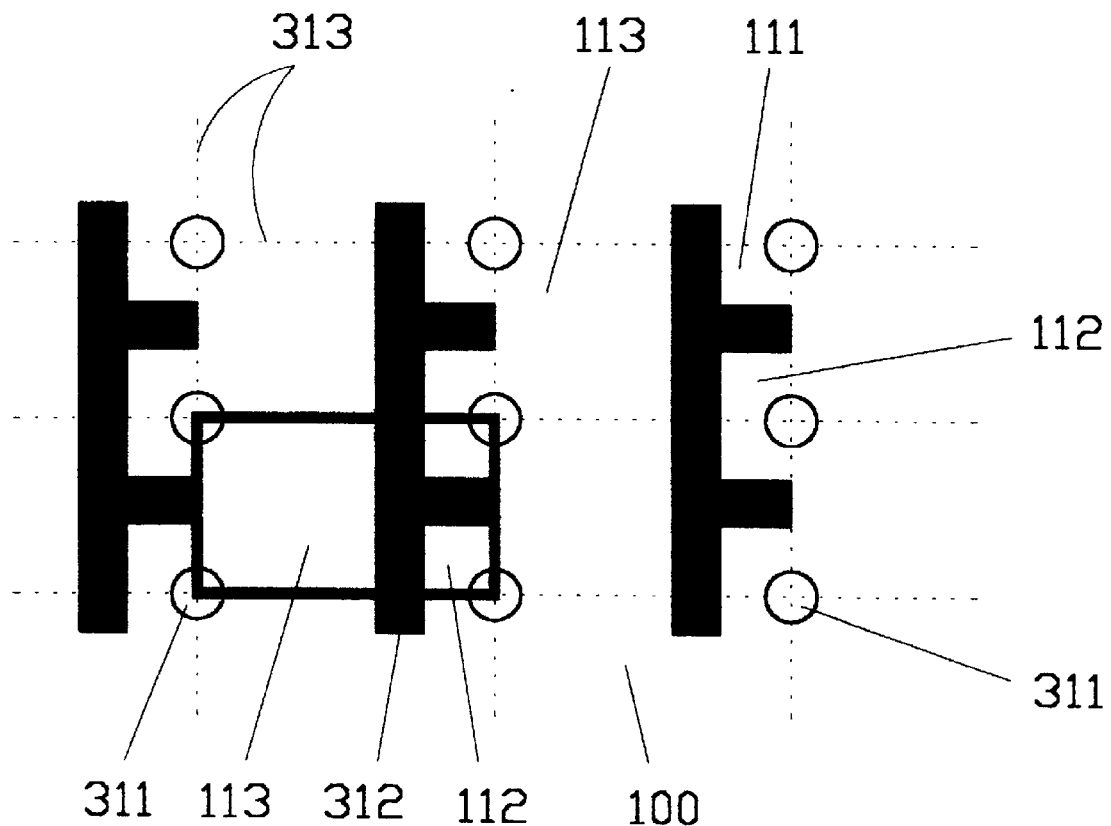
FIG. 3 shows a mass production scheme.

FIG. 3 shows a mass production technique for the laser diodes. The substrate 100 can be large enough to accommodate hundreds and thousands of products. As shown, there are four units on the substrate 100. Nine via holes 311 are pierced in appropriate places. Subsequently these via holes are plated through to connected the top side with the bottom side. After plating and sawing the via holes along the dotted horizontal and vertical lines, these plated through holes appear as arcs 118 shown in FIG. 1. The dark patterns 312 are the etched away areas of the top and bottom conducting surfaces, and separates the first electrode 111, the second electrode 112 and the common electrode 112. The conducting pedestal 114, the laser diode 115 and the light sensor 116 are then separately mounted and wire bonded as shown in FIG. 1. After sawing through the substrate along the dotted lines 313, four final products are fabricated.

Figure 4:
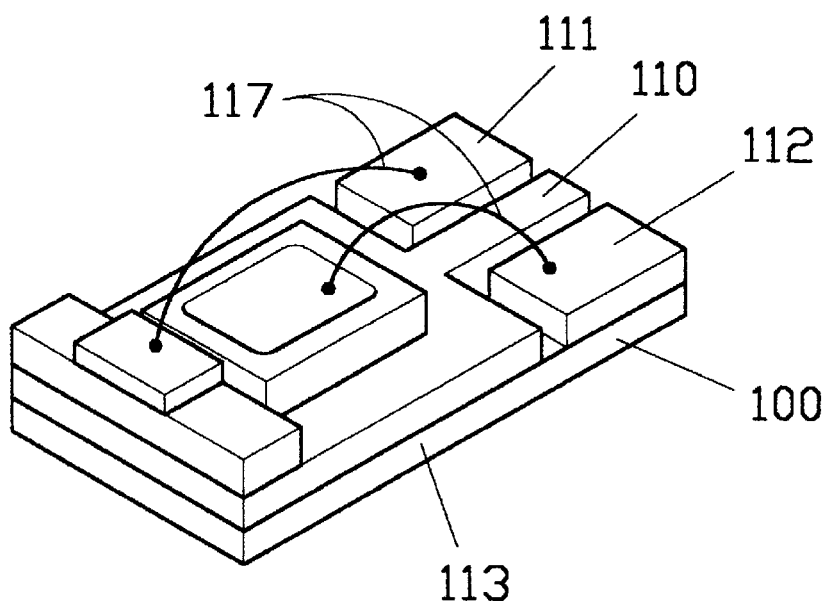
FIG. 4 shows an implementation scheme for a single sided board.

FIG. 4 shows a single sided structure of the present invention. The conducting material 110 is plated only on the upper side of the substrate 100. The conducting surface 110 on top of the substrate 100 is patterned to form a first electrode 111, a second electrode 112 and a common electrode 113. The functions of these electrodes are the same as those shown in FIG. 1. After the different components are mounted on the upper surface of the substrate 100, the bottom surface of the substrate is attached to the mother board. Without the plated through via holes, the different electrodes 111, 112 and 113 are wire-bonded again to other parts on the mother board (not shown).

Figure 5:
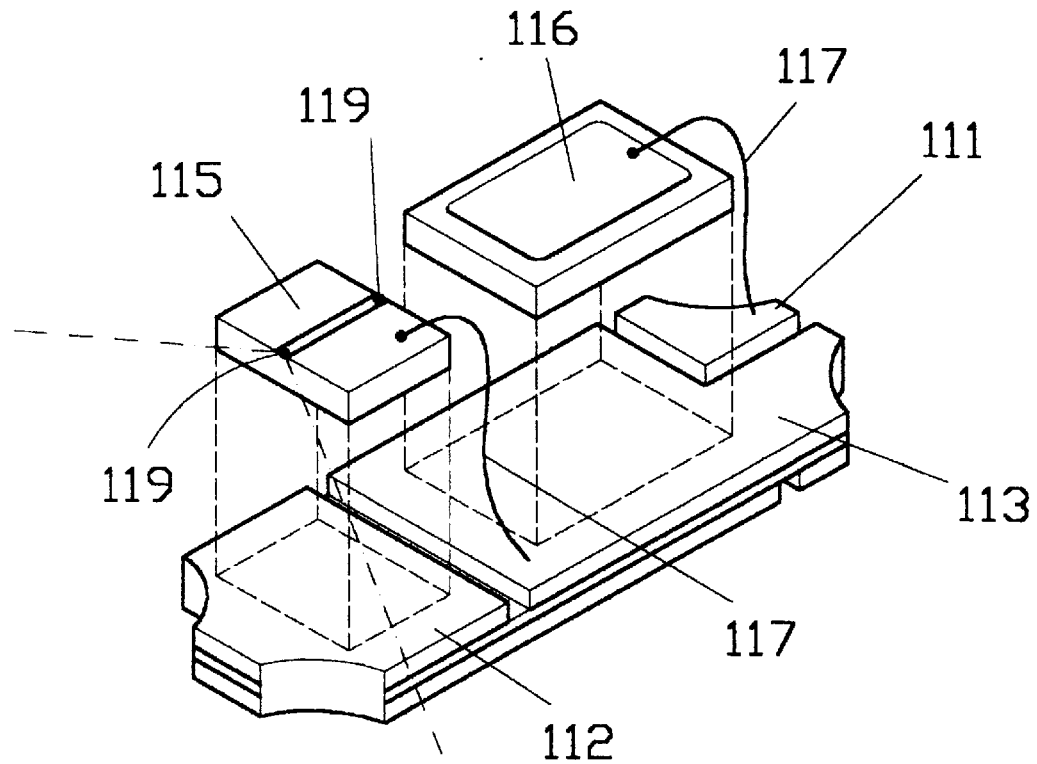
FIG. 5 shows a structure for coherent mode operation.

FIG. 5 shows another embodiment of the present invention without the use of a conducting pedestal 114 shown in FIG. 1. The laser diode 115 operating in coherent resonant mode has two light emitting points 119: one for emitting light outside the package and the other for irradiating a light sensor diode 116. The light sensor diode 116 is placed side by side with the laser diode 115 to detect and adjust the light intensity of the laser diode. The printed circuit board 100 is divided into three sections, including a first electrode 111, a second electrode 112 and a common electrode 113. The laser diode 115 has its bottom side in contact with the second electrode 112. The top side of the laser diode 115 is wire bonded to the common electrode 113. The sensor diode 116 has its top side wire bonded to the first electrode 111, and its bottom side contacting the common electrode 113. The After wire bonding, the process is complete.

Figure 6:
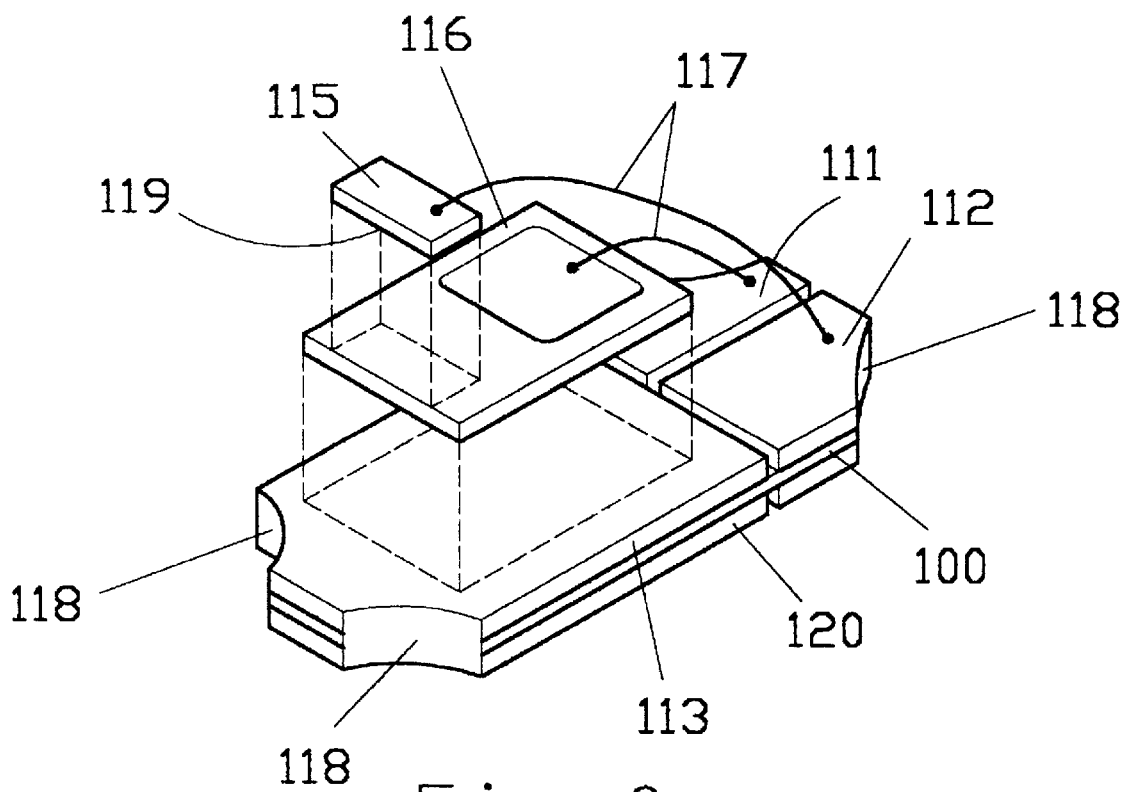
FIG. 6 shows a structure to accommodate an enlarged light sensing diode.

FIG. 6 shows still another embodiment of the present invention. In this structure, the light sensor diode 116 has a relative large ground area with enough space for the laser diode 115 to rest. The laser diode 115 emits light from a point 119 at the bottom of the laser diode. The bottom side of the sensor diode 116 is connected to the common electrode 113. The top terminal of the sensor diode 116 is wire-bonded to electrode 111 through wire 117. The top side of the laser diode 115 is wire bonded to the electrode 112.

Figure 7:
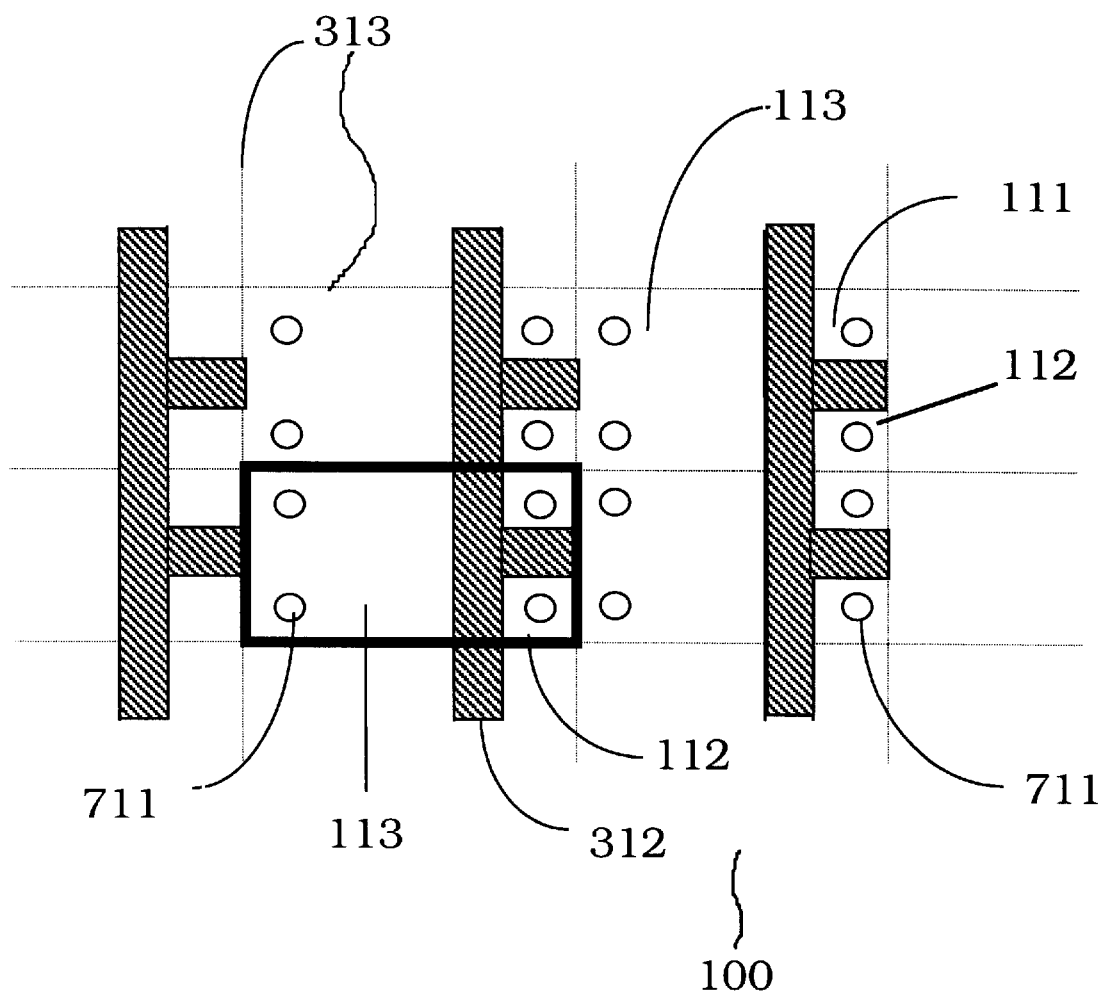
FIG. 7 shows a modification of FIG. 3.

FIG. 7 shows another version of the mass production technique, in which the via holes 711 are not located at the four corners but inside the boundaries 313 of the package. The individual packages 113 are diced by sawing through these boundaries 313.

FIG. 8 shows the structure of a cover for the package used in FIGS. 2, 5 and 6. An opening 802 is cut at the end of the cover 800 to allow laser beam to emit.

FIG. 9 shows another design of the cover 900 with enclosed sides 902. This kind of cover is transparent and used without an opening for light to emit.

The foregoing embodiments are only examples of the techniques used in this invention. The invention is by no means limited to these embodiments. Any equivalent structures are all within the scope of this invention.

What is claimed is:

1. A package for a laser diode comprising:

an insulating substrate, having at least a topside deposited with a conducting material, which is patterned into three sections to form a first electrode, a second electrode and a common electrode;

a laser diode with one side contacting the conducting layer on the top side of said substrate, and another side wire-bonded to said second electrode;

a sensor diode for sensing the light intensity emitted from said laser diode mounted beside said laser diode having a top side wire-bonded to said first electrode and a bottom side contacting said top side of said substrate; and plated through via holes connecting said first electrode, said second electrode and said common electrode from the top side of said substrate to the bottom side of said substrate to form a surface-mounted flat package.

2. A package as described in claim 1, wherein said via hole are shaped as an arc of a circle at the four corners of said substrate.

3. A package as described in claim 1, wherein said laser diode is connected to said common electrode through a conducting pedestal.

4. A package as described in claim 1, wherein said conducting material is deposited on one side of said substrate.

5. A package as described in claim 1, wherein said conducting material is deposited on both the top side and the bottom side of said substrate.

6. A package as described in claim 5, wherein said laser diode emits light in a direction facing said light sensor diode.

7. A package as described in claim 5, wherein the light emitted from said laser is coherent.

8. A package as described in claim 1, wherein said package is sealed except the light emitting point of said laser diode.

9. A package as described in claim 1, wherein said laser diode has a bottom side amounted directly on said second electrode and a top side wire-bonded to said common electrode, and said light sensing diode has the bottom side mounted directly on said common electrode.

10. A package as described in claim 1, wherein said light sensor diode has an enlarged bottom electrode on which said laser diode is mounted with the top side of said laser diode wire-bonded to said second electrode.

11. A package as described in claim 1, further comprising a cover to enclose said package.

12. A package as described in claim 11, wherein said cover has an opening to allow the light emitted from said laser diode to irradiate.

13. A package as described in claim 11, wherein said cover is transparent.

* * * * *

UNITED STATES PATENT AND TRADEMARK OFFICE
CERTIFICATE OF CORRECTION

PATENT NO. : 5,903,584
DATED : May 11, 1999
INVENTOR(S) : Jiahn - Chang

It is certified that error appears in the above-identified patent and that said Letters Patent is hereby corrected as shown below:

On the title page; Item [73],

"Assignee: Youngtek Electronics, Hsin-Chu, Taiwan" on the issued patent
should be corrected as:
--Assignee: Bily WANG, Hsin-Chu, Taiwan--

Signed and Sealed this

Sixth Day of June, 2000

*Attest:*

*Attesting Officer*

Q. TODD DICKINSON

*Director of Patents and Trademarks*

UNITED STATES PATENT AND TRADEMARK OFFICE
CERTIFICATE OF CORRECTION

PATENT NO. : 5,903,584

DATED : May 11, 1999

INVENTOR(S) : Wu Jiahn-Chang

It is certified that error appears in the above-identified patent and that said Letters Patent is hereby corrected as shown below: Title page, item [73]

"Assignee: Youngtek Electronics, Hsin-Chu,
           Taiwan"
should be corrected as:
--Assignee: Bily WANG, Hsin-Chu,
           Taiwan--

Signed and Sealed this

Twelfth Day of September, 2000

Attest:

Q. TODD DICKINSON

Attesting Officer

Director of Patents and Trademarks